United States Patent
Hoshi et al.

(10) Patent No.: US 12,142,672 B2
(45) Date of Patent: Nov. 12, 2024

(54) HETEROJUNCTION BIPOLAR TRANSISTOR AND MANUFACTURING METHOD OF THE SAME

(71) Applicant: Nippon Telegraph and Telephone Corporation, Tokyo (JP)

(72) Inventors: Takuya Hoshi, Tokyo (JP); Yuki Yoshiya, Tokyo (JP); Yuta Shiratori, Tokyo (JP); Hiroki Sugiyama, Tokyo (JP); Minoru Ida, Tokyo (JP); Hideaki Matsuzaki, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 420 days.

(21) Appl. No.: 17/612,463

(22) PCT Filed: May 29, 2019

(86) PCT No.: PCT/JP2019/021213
§ 371 (c)(1),
(2) Date: Nov. 18, 2021

(87) PCT Pub. No.: WO2020/240725
PCT Pub. Date: Dec. 3, 2020

(65) Prior Publication Data
US 2022/0208998 A1    Jun. 30, 2022

(51) Int. Cl.
*H01L 29/737* (2006.01)
*H01L 21/02* (2006.01)
*H01L 29/66* (2006.01)

(52) U.S. Cl.
CPC ........ *H01L 29/737* (2013.01); *H01L 21/0254* (2013.01); *H01L 29/66318* (2013.01)

(58) Field of Classification Search
CPC .............. H01L 29/737; H01L 21/0254; H01L 29/66318; H01L 29/0817; H01L 29/0821; H01L 29/7371; H01L 29/2003
See application file for complete search history.

(56) References Cited

U.S. PATENT DOCUMENTS

| 2005/0121696 A1* | 6/2005 | Nakazawa | H01L 29/7371 257/E29.189 |
| 2011/0278586 A1* | 11/2011 | Ando | H01L 29/0649 257/E29.089 |

(Continued)

OTHER PUBLICATIONS

Zhang, L. et al., "AlGaN/GaN Heterojunction Bipolar Transistor With Selective-Area Grown Emitter and Improved Base Contact," IEEE Transactions on Electron Devices, vol. 66, No. 3, Mar. 2019, 5 pages.

(Continued)

*Primary Examiner* — Andres Munoz
*Assistant Examiner* — Ashley Nicole Blackwell
(74) *Attorney, Agent, or Firm* — Slater Matsil, LLP (57) ABSTRACT

An emitter contact layer, an emitter layer, a base layer, a p-type base layer, a collector layer, and a sub-collector layer are crystal-grown over a first substrate in this order with the main surface as the Group III polar surface. The emitter contact layer includes a nitride semiconductor that is made n-type at a relatively high concentration. The emitter layer includes a nitride semiconductor having a bandgap larger than that of the nitride semiconductor constituting the emitter contact layer. The base layer includes an undoped nitride semiconductor having a bandgap smaller than that of the nitride semiconductor constituting the emitter layer. The p-type base layer includes the same nitride semiconductor as the base layer and made p-type.

20 Claims, 8 Drawing Sheets (56) References Cited

U.S. PATENT DOCUMENTS

2016/0133732 A1* 5/2016 Umemoto ............. H01L 29/205
                                                                257/197
2018/0012979 A1* 1/2018 Umemoto ........... H01L 29/7371
2018/0175182 A1* 6/2018 Kawai ................. H01L 29/7373

OTHER PUBLICATIONS

Dupuis, R. et al., "III-N High-Power Bipolar Transistors," The Electrochemical Society Transactions, vol. 58, No. 4, 2013, 7 pages.

Mccarthy, L. et al., "AlGaN/GaN Heterojunction Bipolar Transistor," IEEE Electron Device Letters, vol. 20, No. 6, Jun. 1999, 3 pages.

Mccarthy, L. et al., "GaN HBT: Toward an RF Device," IEEE Transactions on Electron Devices, vol. 48, No. 3, Mar. 2001, 9 pages.

Ando, Y. et al., "Fabrication of Collector-top Vertical Gallium Nitride Heterojunction Bipolar Transistor with 2DHG," Proceedings of the 64th JSAP Spring Meeting, Mar. 14, 2017, 3 pages.

* cited by examiner

HETEROJUNCTION BIPOLAR TRANSISTOR AND MANUFACTURING METHOD OF THE SAME

This patent application is a national phase filing under section 371 of PCT/JP2019/021213, filed on May 29, 2019, which application is incorporated herein by reference in its entirety.

TECHNICAL FIELD

The present invention relates to a heterojunction bipolar transistor and a method for producing the same.

BACKGROUND

Nitride semiconductors such as gallium nitride (GaN) have a large bandgap and high dielectric breakdown electric field strength, and thus are promising as power devices having high withstand voltage characteristics and as high-power, high-frequency devices. GaN has a hexagonal wurtzite structure as a stable phase and has polarization in the c-axis direction. High electron mobility transistors (HEMTs) that form high-concentration two-dimensional electron gas at the AlGaN/GaN interface by utilizing the effect of polarization generated in the c-axis direction have been actively studied.

On the other hand, heterojunction bipolar transistors (HBTs), which can have a high current density and power density, are expected to be applied to high-frequency and power usage. As is well known, HBTs include an emitter, a base, and a collector. HBTs using nitride semiconductors are produced as described below. First, a GaN sub-collector and a GaN collector are formed over a substrate made of sapphire or the like, via a buffer formed from GaN or AlN.

In a typical npn-type HBT, the GaN sub-collector is formed as an $n^+$ type, and the GaN collector is formed as an n-type (or undoped, unintentionally doped (UID)). The sub-collector layer is doped with a high concentration in order to reduce the resistance. In addition, regarding the thickness of the collector layer, there is a tradeoff between the carrier running time and the withstand voltage, and the thinner the collector layer, the higher the blocking frequency (ft), but the lower the withstand voltage. Therefore, the design is made in consideration of the trade-off. A p-type doped GaN base layer is formed on the collector layer. The higher the base doping concentration, the higher the maximum oscillation frequency (fmax) of the high-frequency elements, so that the concentration of the base layer is made as high as possible.

On the other hand, when the concentration of the base is increased, the recombination current near the emitter-base interface increases and the current gain decreases. Therefore, a material having a bandgap larger than that of the base is usually employed for the emitter layer. For example, when the base layer is formed from GaN, the emitter layer is formed from AlGaN. Further, a high-concentration n-type doped GaN contact layer for emitter contact is formed on the AlGaN emitter (Non Patent Literatures 1 and 2).

Even in the above-described HBTs using nitride semiconductors, device characteristics that make use of the features such as high current gain and current density have already been reported (Non Patent Literatures 3 and 4). However, the high-frequency performance of these reported HBTs is inferior to that of the above-described HEMTs, and particularly there is a challenge in increasing the maximum oscillation frequency fmax. The biggest factor that limits the performance of HBTs using nitride semiconductors is the high concentration of impurities in the p-type layer.

For example, to make GaN p-type, a technique is typically used in which bizcyclopentadienyl magnesium (Cp2-Mg) is used as a doping material and Mg is added during epitaxial growth to carry out crystal growth of gallium nitride. However, in this technique, even if about $1 \times 10^{19}$ cm$^{-3}$ of Mg is doped as an acceptor, the activation rate is as low as about several %, and the concentration of holes as free carriers is on the order of $10^{17}$ cm$^{-3}$.

In order to solve such a low hole concentration of GaN, a technique using a two-dimensional hole gas generated by polarization has been reported (Non Patent Literature 5). In the technique of Non Patent Literature 5, after growing $n^+$ GaN as an emitter contact layer on a self-supporting substrate formed from GaN, an undoped AlGaN (50 mn, Al composition 0.1) emitter layer, undoped GaN (20 nm), and Mg-doped p-type GaN (Mg: $1 \times 10^{19}$ cm$^{-3}$, 80 nm) are formed as a base layer.

The plane orientation of GaN on a typical GaN substrate is Ga polarity (Group III polarity, +C axis direction). In this case, a two-dimensional hole gas is formed at the interface between the AlGaN emitter and the undoped GaN due to the influence of piezoelectric polarization and spontaneous polarization. By using this effect and increasing the hole concentration in the base layer, there is a possibility that an HBT having a lower base resistance can be produced. However, in the case of this technique, since crystal growth is carried out using the Group III polar surface, the two-dimensional hole gas is formed at the interface with the undoped GaN formed on AlGaN. Therefore, it is necessary to form AlGaN, which is a wide-gap material, on the substrate side (lower side) of the base.

In a typical npn structure HBT, the emitter layer has a wider gap than the base layer for the purpose of improving the current gain as described above. Therefore, since it is necessary to form AlGaN on the lower side of the base, AlGaN must act as an emitter, so that the HBT needs to be of the so-called collector-top (or collector-up) type, where the emitter is below the base.

The collector top structure has the advantage that the base-collector capacitance can be reduced if the collector electrode can be made smaller, but the emitter mesa diameter cannot be reduced. Therefore, there is concern that the injection current density cannot be increased and that high-frequency characteristics, current gain, and withstand voltage, such as the surface level, are affected. If the above-described structure is forcibly applied to an emitter-up structure, AlGaN will be further formed on the p-GaN, but in this case, the band bends in the direction of canceling the holes due to the effect of polarization, which impairs the characteristics.

In order to achieve an emitter top structure with the technique of Non Patent Literature 5 enabled, a technique of producing a device by N polarity (−C surface growth) can be considered. In the N-polar surface growth, the polarization axis of the crystal is reversed as compared with the Group III polar surface growth. Therefore, in order to form a two-dimensional hole gas, a buffer layer necessary for N-polar growth is first formed on the substrate, then a sub-collector layer and a collector layer are grown, and then a heterostructure of undoped GaN/undoped AlGaN is formed on the p-type GaN.

By performing N-polar growth in this way, it is expected that a high-concentration two-dimensional hole gas can be formed at the AlGaN emitter/undoped GaN interface in an emitter-top GaN HBT and that the base resistance can be reduced, but there are some problems in achieving such a structure.

The biggest problem is the difficulty of N-polar surface growth. In order to carry out N-polar growth, a buffer layer obtained by surface-nitriding a sapphire substrate, a special buffer layer using the C surface of a SiC substrate, or the like is required. Even if such a special buffer layer is used, the crystal quality (defect density and flatness) is inferior to that of a typical Group III polar surface. In addition, in the above-described structure by N-polar growth, undoped GaN is formed on the p-type GaN layer and AlGaN is further grown, but since p-type GaN is doped with Mg, the growth conditions are significantly different from those of ordinary GaN. It is not easy to form high quality GaN or AlGaN on such p-type GaN.

The current gain of HBTs is greatly affected by the quality of the emitter and emitter-base interface. Therefore, it is assumed that the structure by N-polar growth in which p-type GaN is grown first has difficulty in obtaining the desired current gain characteristics.

CITATION LIST

Non Patent Literature

Non Patent Literature 1: L. S. McCarthy et al., "AlGaN/GaN Heterojunction Bipolar Transistor", IEEE Electron Device Letters, vol. 20, no. 6, pp. 227-279, 1999.
Non Patent Literature 2: Lee S. McCarthy et al., "GaN HBT: Toward an RF Device", IEEE Transactions on Electron Devices, vol. 48, no. 3, pp. 543-551, 2001.
Non Patent Literature 3: L. Zhang et al., "AlGaN/GaN Heterojunction Bipolar Transistor With Selective-Area Grown Emitter and Improved Base Contact" IEEE Transactions on Electron Devices, vol. 66, no. 3, pp. 1197-1210, 2019.
Non Patent Literature 4: R. D. Dupuis et al., "III-N High-Power Bipolar Transistors", The Electrochemical Society Transactions, vol. 58, no. 4, pp. 261-267, 2013.
Non Patent Literature 5: Yuto Ando et al., "Fabrication of Collector-top Vertical Gallium Nitride Heterojunction Bipolar Transistor with 2DHG", Proceedings of the 64th JSAP Spring Meeting, 15a-315-7, 12-129, 2017.

SUMMARY

Technical Problem

As described above, in the related art, a heterojunction bipolar transistor using a nitride semiconductor is expected to have a higher withstand voltage than a field effect transistor structure, but has difficulty in lowering the resistance by increasing the hole concentration in the base layer, and thus there is a problem that it is difficult to improve high-frequency characteristics.

As a technique for increasing the hole concentration of the p-type layer, there is a technique using AlGaN/GaN polarization. However, in the related-art crystal growth technique using the +c surface, it is necessary to form the AlGaN layer below the GaN layer in order to form the two-dimensional hole gas, so that a collector top structure is required. By using the −c surface (N-polar surface), AlGaN can be formed on the upper layer of GaN to obtain a two-dimensional hole gas, but N-polar growth is difficult and AlGaN needs to grow after the p-type layer, so that there is a problem that crystal growth is extremely difficult.

Embodiments of the present invention have been made to solve the above problems, and an object thereof is to enhance higher-frequency characteristics of a heterojunction bipolar transistor using a nitride semiconductor without adopting a collector top structure.

Means for Solving the Problem

The method for producing a heterojunction bipolar transistor according to embodiments of the present invention includes: a first step of crystal-growing, over a first substrate in a following order with a main surface as a Group III polar surface, an emitter contact layer comprising a nitride semiconductor that is made n-type, an emitter layer comprising a nitride semiconductor having a bandgap larger than that of the nitride semiconductor constituting the emitter contact layer, a base layer comprising an undoped nitride semiconductor having a bandgap smaller than that of the nitride semiconductor constituting the emitter layer, a p-type base layer comprising the same nitride semiconductor as that of the base layer and made p-type, a collector layer comprising a nitride semiconductor that has the same bandgap as that of the nitride semiconductor constituting the p-type base layer and that is made n-type, and a sub-collector layer comprising the same nitride semiconductor as that of the collector layer and made n-type; a second step of bonding the first substrate and a second substrate; a third step of removing the first substrate to create a state in which the sub-collector layer, the collector layer, the p-type base layer, the base layer, the emitter layer, and the emitter contact layer are formed over the second substrate in this order with the main surface as a Group V polar surface; a fourth step of patterning the emitter contact layer into a mesa shape; a fifth step of forming a base electrode that is ohmic-connected to the p-type base layer on the emitter layer on a side of the mesa-shaped emitter contact layer; and a sixth step of forming an emitter electrode on the emitter contact layer.

In one configuration example of the method for producing the heterojunction bipolar transistor, the fifth step includes a step of thinning the emitter layer at a portion where the base electrode is formed, and a step of forming the base electrode on the thinned emitter layer.

One configuration example of the method for producing the heterojunction bipolar transistor further includes a seventh step of forming a first metal layer serving as a collector electrode on the sub-collector layer, and an eighth step of forming a second metal layer on the second substrate, the seventh step and the eighth step being performed before the second step, wherein in the second step, the first substrate and the second substrate are bonded together with the first metal layer and the second metal layer facing each other.

In one configuration example of the method for producing the heterojunction bipolar transistor, the emitter contact layer, the base layer, the p-type base layer, the collector layer, and the sub-collector layer each comprise GaN, and the emitter layer comprises AlGaN.

The heterojunction bipolar transistor according to embodiments of the present invention includes a sub-collector layer on a substrate, the sub-collector layer including a nitride semiconductor that is made n-type at a relatively high concentration, a collector layer on the sub-collector layer, the collector layer including the same nitride semiconductor as that of the sub-collector layer and being made n-type, a p-type base layer on the collector layer, the p-type base layer including a nitride semiconductor having the same bandgap as that of the nitride semiconductor constituting the collector layer and being made p-type, a base layer on the p-type base layer, the base layer including the same nitride semiconductor as that of the p-type base layer and being undoped, an emitter layer on the base layer, the emitter layer including a nitride semiconductor having a bandgap larger than that of the nitride semiconductor constituting the base layer, a mesa-shaped emitter contact layer on the emitter layer, the mesa-shaped emitter contact layer including a nitride semiconductor having a bandgap smaller than that of the nitride semiconductor constituting the emitter layer and being made n-type at a relatively high concentration, a base electrode on the emitter layer on a side of the emitter contact layer, the base electrode being ohmic-connected to the base layer, an emitter electrode on the emitter contact layer, and a collector electrode connected to the sub-collector layer, wherein the sub-collector layer, the collector layer, the p-type base layer, the base layer, the emitter layer, and the emitter contact layer are formed over the substrate with a main surface as a Group V polar surface.

In one configuration example of the above heterojunction bipolar transistor, the emitter layer at a portion where the base electrode is formed is formed thinner than a region other than the portion.

One configuration example of the above heterojunction bipolar transistor includes a metal layer between the substrate and the sub-collector layer, the metal layer serving as the collector electrode.

In one configuration example of the above heterojunction bipolar transistor, the emitter contact layer, the base layer, the p-type base layer, the collector layer, and the sub-collector layer each comprise GaN, and the emitter layer comprises AlGaN.

Effects of Embodiments of the Invention

As described above, according to embodiments of the present invention, the sub-collector layer, the collector layer, the p-type base layer, the base layer, the emitter layer, and the emitter contact layer are formed over the substrate with the main surface as a Group V polar surface, so that the high-frequency characteristics of the heterojunction bipolar transistor using a nitride semiconductor can be enhanced without adopting a collector top structure.

DETAILED DESCRIPTION OF ILLUSTRATIVE EMBODIMENTS

Hereinafter, a method for producing a heterojunction bipolar transistor according to embodiments of the present invention will be described with reference to FIGS. 1A to 1P.

Figure 1A:
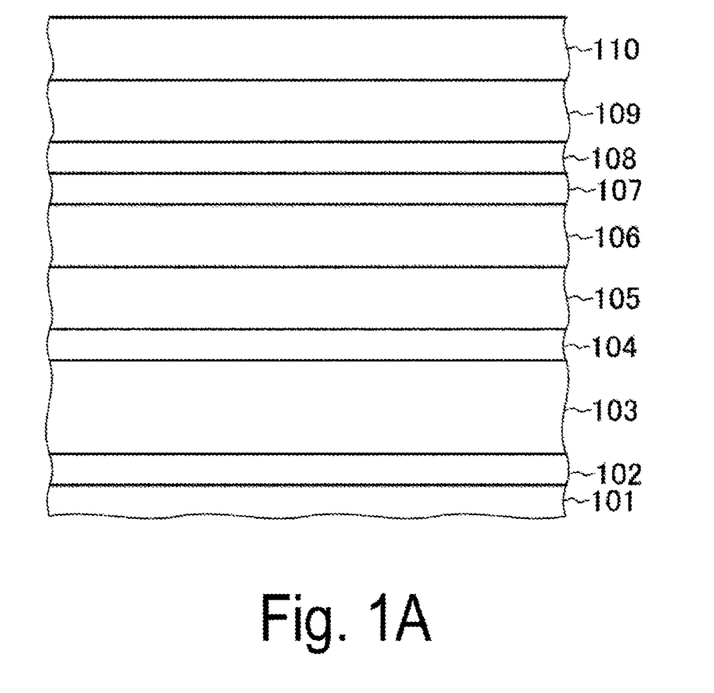
FIG. 1A is a cross-sectional view illustrating a state of an intermediate process for describing a method for producing a heterojunction bipolar transistor according to an embodiment of the present invention.

First, as illustrated in FIG. 1A, an emitter contact layer 105, an emitter layer 106, a base layer 107, a p-type base layer 108, a collector layer 109, and a sub-collector layer 110 are crystal-grown in this order over a first substrate 101 with the main surface as a Group III polar surface (first step).

The first substrate 101 is not limited as long as it allows typical GaN, AlGaN, or InGaN crystal growth and allows peeling or removal of the first substrate 101 described later. The first substrate 101 may be formed from, for example, silicon or sapphire ($Al_2O_3$).

The emitter contact layer 105 is formed from a nitride semiconductor (for example, GaN) that is made n-type at a relatively high concentration, for example, an impurity concentration of $1\times10^{19}/cm^3$ or more. The emitter contact layer 105 is in contact with an emitter electrode described later to form an emitter contact and thus is formed such that the doping concentration is increased to some extent.

The emitter layer 106 is formed from a nitride semiconductor (for example, AlGaN) having a bandgap larger than that of the nitride semiconductor constituting the emitter contact layer 105. The emitter layer 106 is a layer for forming a two-dimensional hole gas by the effect of polarization in the c-axis direction of the nitride semiconductor. Further, the emitter layer 106 functions as an emitter of a heterojunction bipolar transistor.

The emitter layer 106 may be formed from, for example, AlGaN having a uniform composition, and may also have a "graded AlGaN" structure in which the Al composition gradually increases from the side of the emitter contact layer 105 toward the side of the base layer 107. Further, an Al composition of the emitter layer 106 may be zero at a position where the emitter layer 106 comes into contact with the emitter contact layer 105. With such a configuration, the band offset of the heterojunction at the emitter/emitter contact interface described later becomes small, which makes it difficult to form a two-dimensional electron gas at this interface.

The base layer 107 is formed from an undoped nitride semiconductor (for example, GaN) having a bandgap smaller than that of the nitride semiconductor constituting the emitter layer 106. The base layer 107 is formed on the emitter layer 106 when viewed from the first substrate 101. Since the base layer 107 forms the main surface as a Group III polar surface, a two-dimensional hole gas is formed at the interface between the base layer 107 and the emitter layer 106. The p-type base layer 108 is formed from the same nitride semiconductor (for example, GaN) as that of the base layer 107 and made p-type. Mg is typically used as the p-type dopant for making the p-type base layer 108 p-type. Since the p-type base layer 108 is p-type doped, the band of the base layer 107 is strongly bent toward the interface with the emitter layer 106, and a two-dimensional hole gas is formed.

The collector layer 109 is formed from an n-type nitride semiconductor (for example, GaN) having the same bandgap as that of the nitride semiconductor constituting the p-type base layer 108. The collector layer 109 is doped with n-type impurities at a relatively low concentration. The sub-collector layer 110 is formed from the same nitride semiconductor (for example, GaN) as that of the collector layer 109, and made n-type at a relatively high concentration, for example an impurity concentration of $1 \times 10^{19}/cm^3$ or higher. The sub-collector layer 110 also functions as a collector contact, and is formed in a state where the doping concentration is increased to some extent, like the emitter contact layer 105.

Here, a nucleation layer 102, a sacrificial layer 103, and an etch stop layer 104 are formed over the first substrate 101, and the emitter contact layer 105 is formed on the etch stop layer 104.

The nucleation layer 102 is a layer that serves as a nucleus at the initial stage of growth when typical GaN, AlGaN, or InGaN is grown on the first substrate 101, which is formed from a dissimilar material. The material and growth conditions of the nucleation layer 102 are changed according to the material constituting the first substrate 101 and the material of the layer growing over the first substrate 101. In the embodiment, the nucleation layer 102 is formed so that the layer above the nucleation layer 102 has the Group III polar surface as the main surface orientation. In most of the typical GaN growth techniques, the nucleation layer 102 is grown with the Group III polar surface as the main surface orientation, and these techniques can be implemented within the range of known techniques.

The sacrificial layer 103 is a layer that is sacrificed when the etch stop layer 104 is exposed after removal of the first substrate 101, which will be described later. Further, the sacrificial layer 103 is grown to a thickness of about several µm, and also functions as a layer for reducing the penetration dislocation density and improving the crystal quality of the layer above the etch stop layer 104. Further, since the nucleation layer 102 is adjusted so that the Group III polar surface is the main surface orientation, the main surface of each layer above the sacrificial layer 103 is the Group III polar surface. The etch stop layer 104 is a layer for stopping etching when the nucleation layer 102 and the sacrificial layer 103 are removed after the first substrate 101 is removed, which will be described later.

The above-described nucleation layer 102, sacrificial layer 103, etch stop layer 104, emitter contact layer 105, emitter layer 106, base layer 107, p-type base layer 108, collector layer 109, and sub-collector layer 110 can be formed by a well-known crystal growth technique. For example, each of the above-described layers can be sequentially epitaxially grown over the first substrate 101 by a metalorganic chemical vapor deposition method, a molecular beam epitaxy method, a hydride vapor phase growth method, or the like.

The nucleation layer 102, the sacrificial layer 103, the etch stop layer 104, the emitter contact layer 105, the emitter layer 106, the base layer 107, the p-type base layer 108, the collector layer 109, and the sub-collector layer 110 need not be formed by successive epitaxial growth in the same growth apparatus at one time.

For example, the nucleation layer 102, the sacrificial layer 103, the etch stop layer 104, the emitter contact layer 105, the emitter layer 106, the base layer 107, and the p-type base layer 108 are sequentially and continuously formed in the same growth apparatus. At this point, the growth can be stopped once and heat treatment can be performed using another heat treatment apparatus. For example, in technologies such as the metalorganic vapor deposition method, in the growth of GaN that is made p-type at a higher concentration (p$^+$ GaN), holes may be inactivated by H contained in the carrier gas or the raw material. Therefore, a technique for activating an acceptor by heat-treating p$^+$ GaN in an H-free atmosphere after growing is typically used.

Figure 1B:
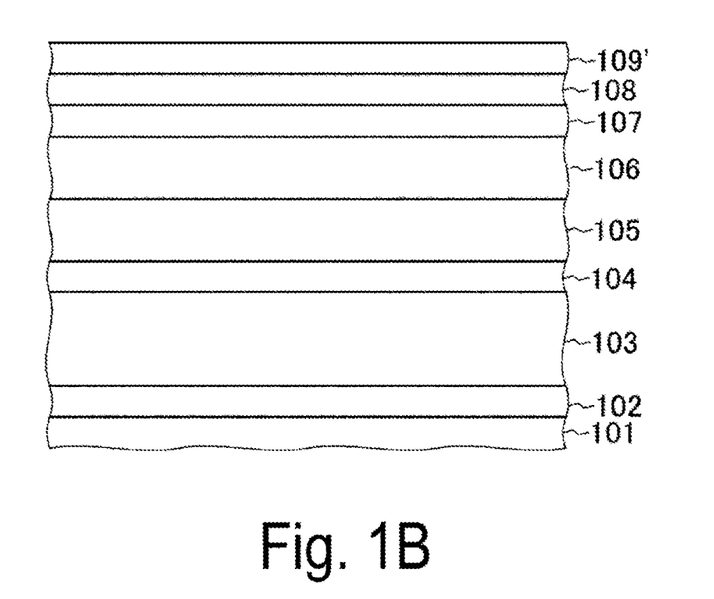
FIG. 1B is a cross-sectional view illustrating a state of an intermediate process for describing the method for producing the heterojunction bipolar transistor according to an embodiment of the present invention.

Alternatively, as illustrated in FIG. 1B, it may be also possible to form a cap layer 109' on a p-type base layer 108, carry the first substrate 101 out of the growth apparatus, carry it into another heat treatment, and perform the above-described high temperature heat treatment. This can reduce deterioration of the surface state of the p-type base layer 108 due to atmospheric exposure. After activation of the acceptor in the p-type base layer 108 by heat treatment, the first substrate 101 is returned to the growth apparatus to grow the collector layer 109 and the sub-collector layer 110.

In this growth process, it is not necessary to use the same apparatus as the growth apparatus in which the growth up to the p-type base layer 108 has been performed. For example, when a growth apparatus performing an organometallic chemical vapor deposition method is used and H is used as the carrier gas, the acceptor of the p-type base layer 108 may be inactivated again. In order to prevent such a problem, a growth apparatus performing a molecular beam epitaxy method capable of performing growth under an ultra-high vacuum is used to grow the collector layer 109 and the sub-collector layer 110.

Figure 1C:
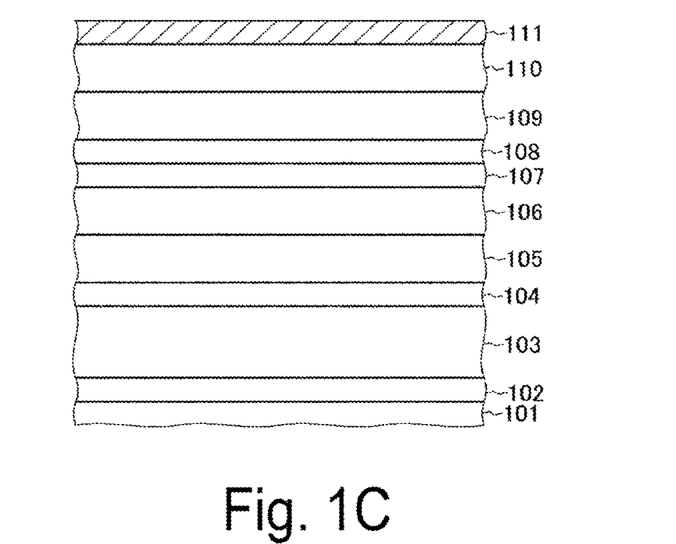
FIG. 1C is a cross-sectional view illustrating a state of an intermediate process for describing the method for producing the heterojunction bipolar transistor according to an embodiment of the present invention.

Next, as illustrated in FIG. 1C, a first metal layer 111 serving as a collector electrode is formed on the sub-collector layer 110 (seventh step). For example, the first metal layer 111 can be formed by depositing a predetermined metal by a deposition technique such as an electron beam deposition method, a resistance heating vapor deposition method, a sputtering method, or a plating method. The first metal layer 111 also functions as an adhesive layer in the bonding described later, and also functions as a sub-collector layer.

The first metal layer 111 is formed from, for example, Ti/Al/Ni/Au in order to form an ohmic connection with the sub-collector layer 110. Further, after each metal constituting the first metal layer 111 is deposited, heat treatment may be performed in order to form an ohmic connection with the sub-collector layer 110. This heat treatment may greatly roughen the surface of the first metal layer 111 and impair the flatness. In such a case, after the heat treatment, the surface of the first metal layer 111 is flattened by a technique such as chemical mechanical polishing (CMP).

The first metal layer 111 may also be formed from a metal having a Schottky contact relationship with the GaN constituting the collector. Considering the operation of the heterojunction bipolar transistor, it is assumed that the emitter is grounded, and in this case, a reverse bias is applied between the base and the collector. Therefore, even in the case of Schottky contact as described above, the current is not limited. In this case, since the annealing treatment for forming the ohmic is not necessary in some cases, it becomes easy to achieve the flatness of the first metal layer 111, which is advantageous in producing a device by joining, which will be described later.

Figure 1D:
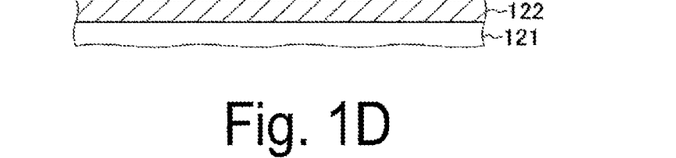
FIG. 1D is a cross-sectional view illustrating a state of an intermediate process for describing the method for producing the heterojunction bipolar transistor according to an embodiment of the present invention.

Next, as illustrated in FIG. 1D, a second substrate 121 is prepared, and a second metal layer 122 is formed on the prepared second substrate 121 (eighth step). Similarly to the above, the second metal layer 122 can be formed by depositing a predetermined metal by a deposition technique such as an electron beam deposition method, a resistance heating vapor deposition method, a sputtering method, or a plating method.

Figure 1E:
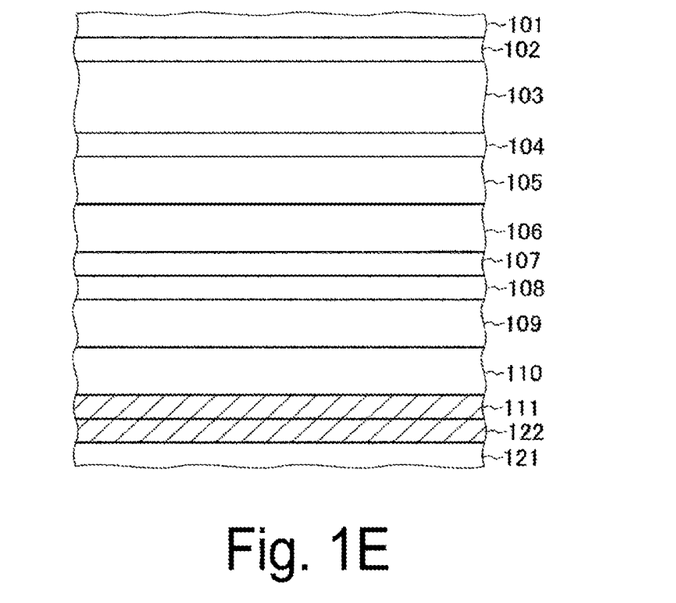
FIG. 1E is a cross-sectional view illustrating a state of an intermediate process for describing the method for producing the heterojunction bipolar transistor according to an embodiment of the present invention.

Next, as illustrated in FIG. 1E, the first substrate 101 and the second substrate 121 are bonded together (second step). The first substrate 101 and the second substrate 121 are bonded together with the sub-collector layer 110 facing the side of the second substrate 121. In the present embodiment, the first metal layer 111 and the second metal layer 122 are used as adhesive layers, and the first substrate 101 and the second substrate 121 are bonded together with the first metal layer 111 and the second metal layer 122 facing each other. The bonding surface of the first metal layer 111 and the bonding surface of the second metal layer 122 are bonded by a predetermined wafer bonding technique. For example, the above-described bonding (pasting) can be performed by a technique such as an atomic diffusion bonding method or a surface activation bonding method. By this bonding, the Group III polar surface of the epitaxial layer structure formed on the first substrate 101 faces the second substrate 121.

Figure 1F:
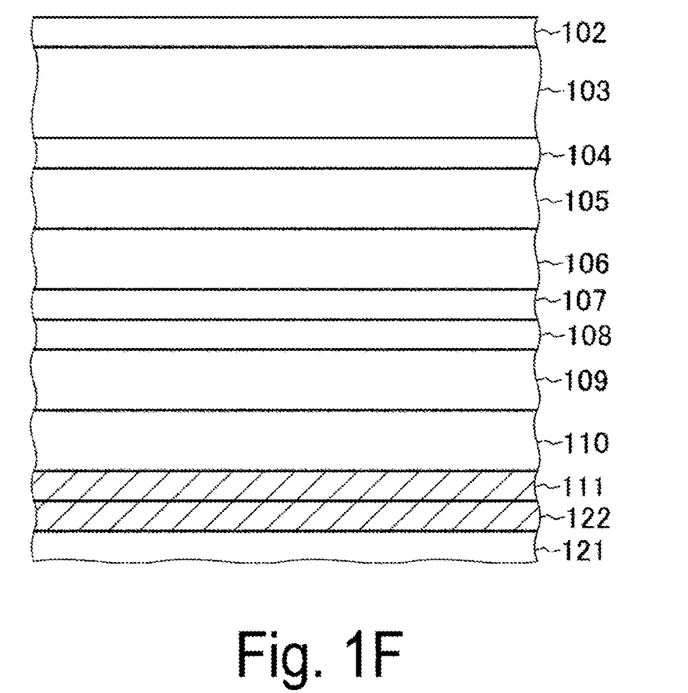
FIG. 1F is a cross-sectional view illustrating a state of an intermediate process for describing the method for producing the heterojunction bipolar transistor according to an embodiment of the present invention.

Next, the first substrate 101 is removed, and as illustrated in FIG. 1F, the sub-collector layer 110, the collector layer 109, the p-type base layer 108, the base layer 107, the emitter layer 106, the emitter contact layer 105, the etch stop layer 104, the sacrificial layer 103, and the nucleation layer 102 are formed in this order over the second substrate 121 with the main surface as a Group V polar surface. In the embodiment, the above-described layers are formed over the second substrate 121 via the second metal layer 122 and the first metal layer 111.

For example, when the first substrate 101 is formed from Si, the first substrate 101 may be removed by a dry etching technique using a well-known fluorine-based gas such as $SF_6$.

Figure 1G:
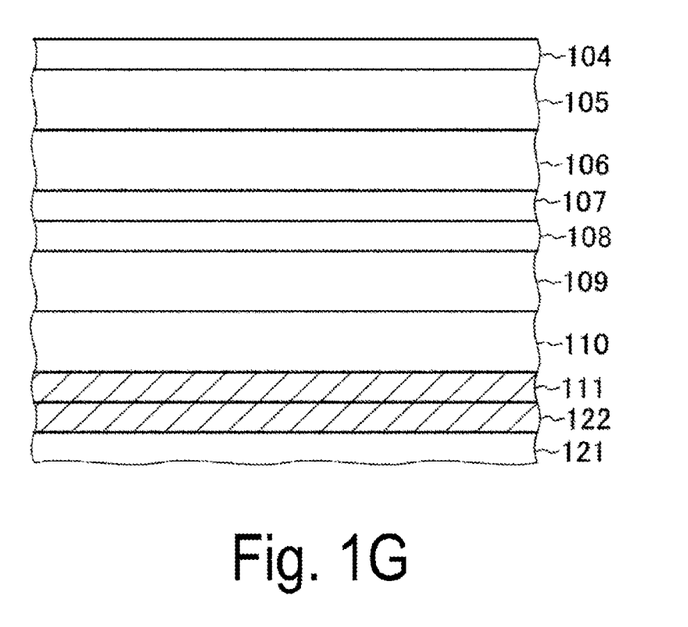
FIG. 1G is a cross-sectional view illustrating a state of an intermediate process for describing the method for producing the heterojunction bipolar transistor according to an embodiment of the present invention.

Next, as illustrated in FIG. 1G, the nucleation layer 102 and the sacrificial layer 103 are removed. A typical dry etching technique may be used to remove the nucleation layer 102 and the sacrificial layer 103. When the etch stop layer 104 is formed from AlGaN, the etching must be stopped at the etch stop layer 104 by selective etching with the sacrificial layer 103 formed from GaN. For example, etching of GaN by thermal decomposition has a high etching selectivity with respect to AlGaN and is suitable for the above-described processing.

Figure 1H:
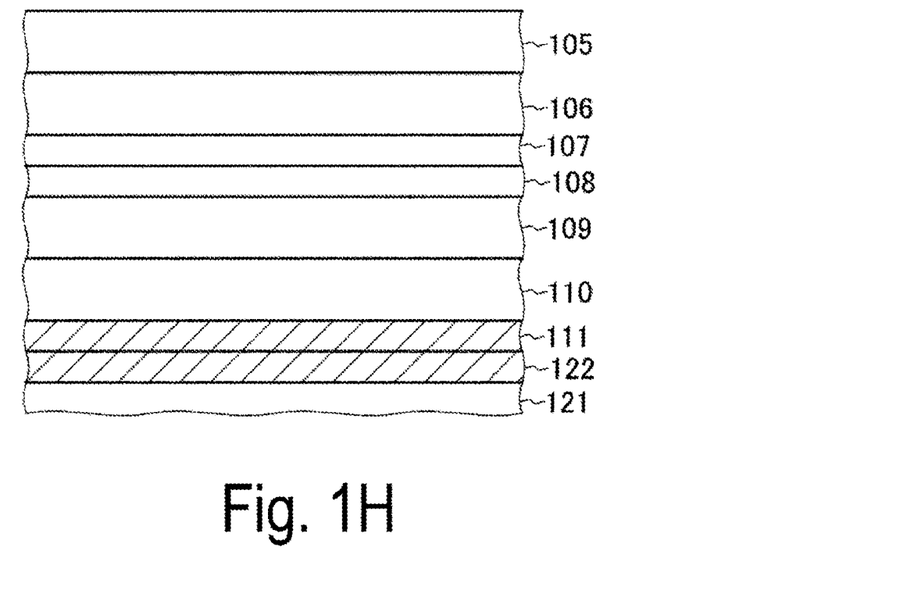
FIG. 1H is a cross-sectional view illustrating a state of an intermediate process for describing the method for producing the heterojunction bipolar transistor according to an embodiment of the present invention.

After removal of the nucleation layer 102 and the sacrificial layer 103 as described above, the etch stop layer 104 is removed, thus creating a state as illustrated in FIG. 1H in which the sub-collector layer 110, the collector layer 109, the p-type base layer 108, the base layer 107, the emitter layer 106, and the emitter contact layer 105 constituting the heterojunction bipolar transistor are formed in this order over the second substrate 121 with the main surface as a Group V polar surface (third step).

In the above description, after the epitaxial growth up to the sub-collector layer 110 over the first substrate 101, the first metal layer 111 is formed and the first metal layer 111 and the second metal layer 122 are bonded, but the present invention is not limited to this. For example, the second substrate 121 may be directly bonded to the sub-collector layer 110 by a direct bonding method. In this case, a step of exposing a portion of the sub-collector layer 110 by dry etching or the like and depositing the collector electrode thereon is further added. When an ohmic contact is formed between the collector electrode and the sub-collector layer 110, an annealing treatment for ohmic formation is further performed. In this case, use of a technique such as laser lift-off enables the first substrate 101 to be removed even if the substrate is formed from sapphire.

Figure 1I:
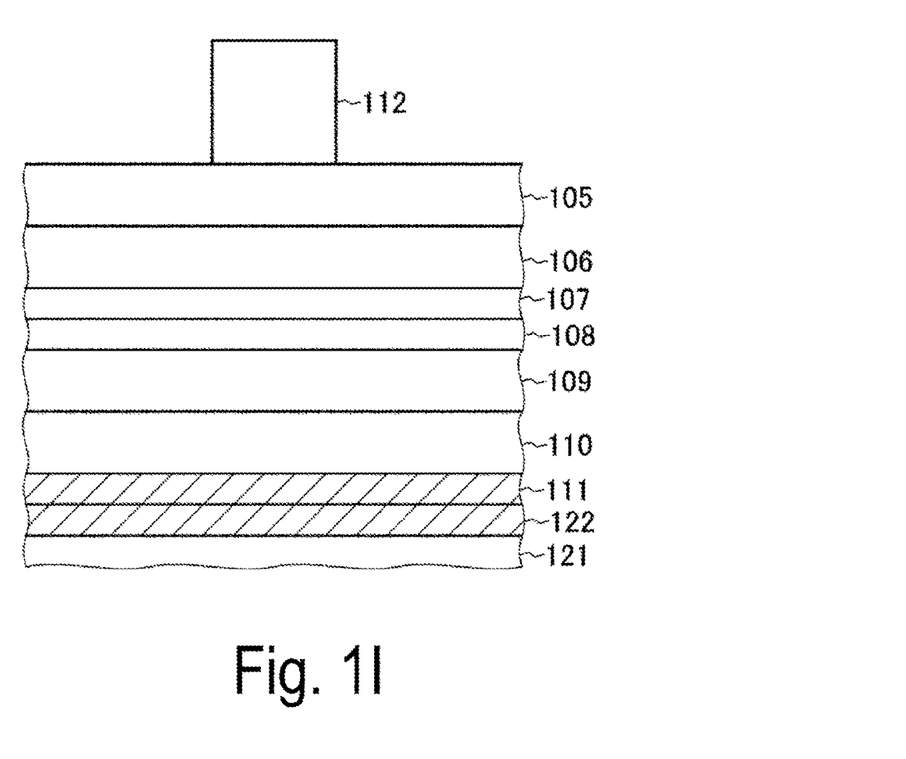
FIG. 1I is a cross-sectional view illustrating a state of an intermediate process for describing the method for producing the heterojunction bipolar transistor according to an embodiment of the present invention.
Figure 1J:
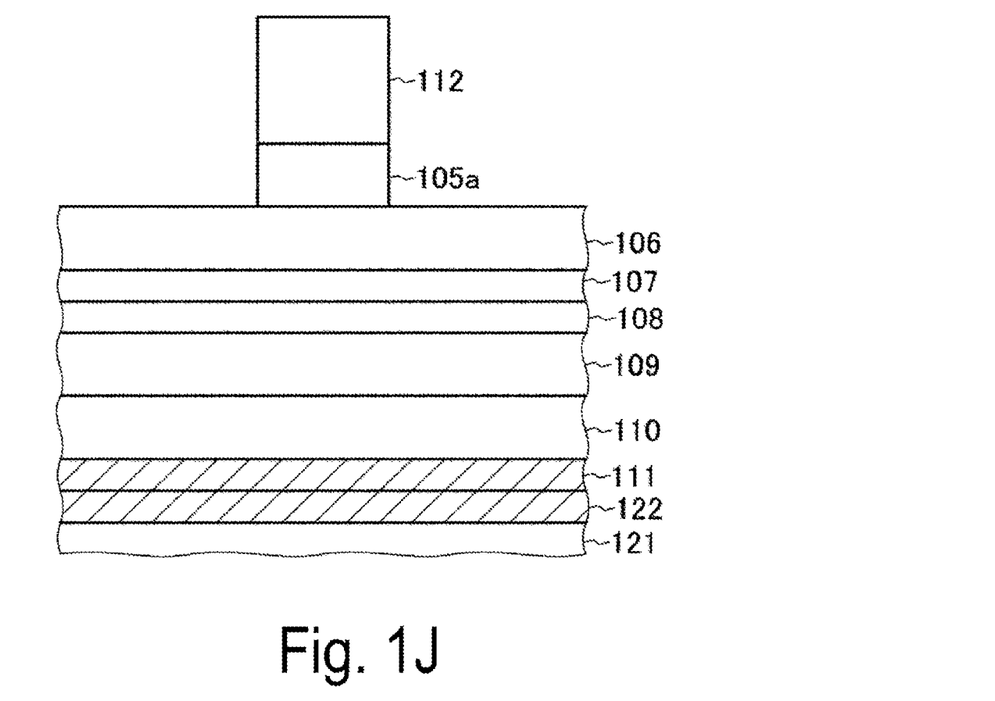
FIG. 1J is a cross-sectional view illustrating a state of an intermediate process for describing the method for producing the heterojunction bipolar transistor according to an embodiment of the present invention.
Figure 1K:
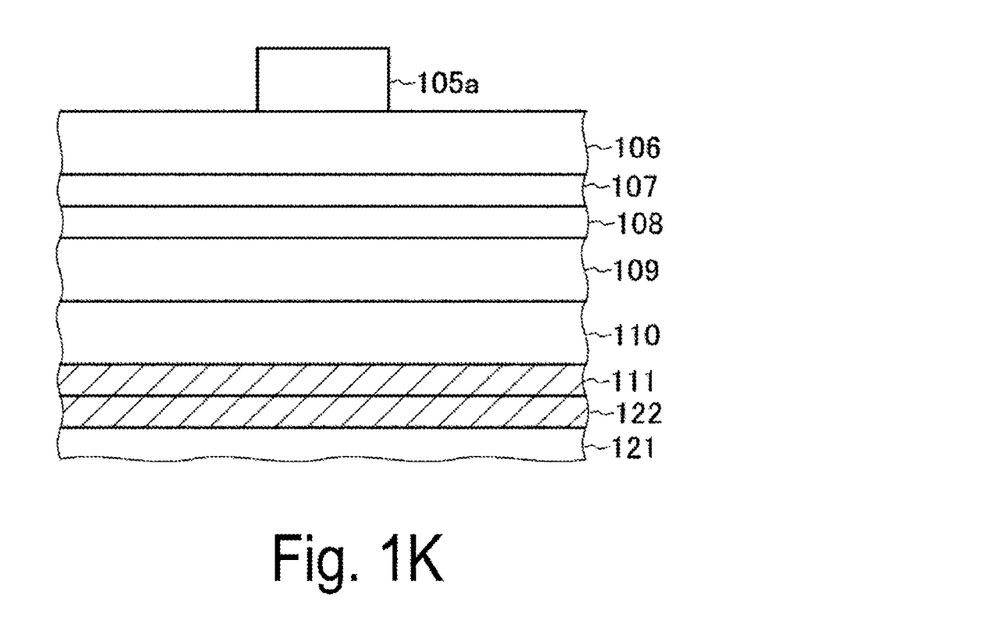
FIG. 1K is a cross-sectional view illustrating a state of an intermediate process for describing the method for producing the heterojunction bipolar transistor according to an embodiment of the present invention.

Next, as illustrated in FIG. 1I, a resist pattern 112 is formed on the emitter contact layer 105. First, a known resist film is formed on the emitter contact layer 105 by a technique such as coating, and exposed and developed by a well-known lithography technique, so that the resist pattern 112 can be formed. Next, with the resist pattern 112 used as a mask, the emitter contact layer 105 exposed to the side thereof is etched and patterned, so that a mesa-shaped emitter contact layer 105a is formed as illustrated in FIG. 1J (fourth step).

The etching described above is stopped at the emitter layer 106. For example, the above-described etching can be stopped by using the selective etching technique by dry etching of the emitter contact layer 105 formed from AlGaN and the emitter layer 106 formed from GaN. In this way, after patterning by etching, the resist pattern 112 is removed (see FIG. 1K).

Figure 1L:
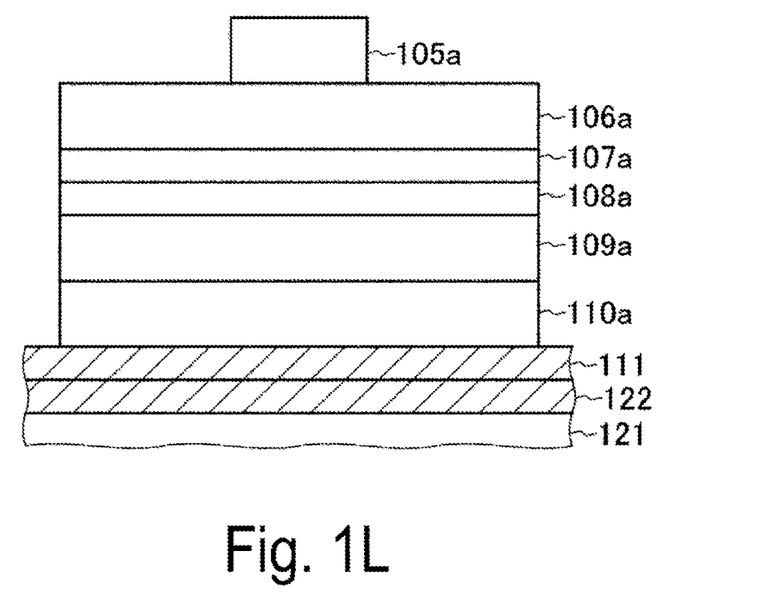
FIG. 1L is a cross-sectional view illustrating a state of an intermediate process for describing the method for producing the heterojunction bipolar transistor according to an embodiment of the present invention.

Next, the laminated structure of the sub-collector layer 110, the collector layer 109, the p-type base layer 108, the base layer 107, and the emitter layer 106 is patterned into a mesa shape by the same lithography technology and etching technology as described above, thereby a sub-collector layer 110a, a collector layer 109a, a p-type base layer 108a, a base layer 107a, and an emitter layer 106a having a mesa structure are formed as illustrated in FIG. 1L. This mesa structure is formed larger than the emitter contact layer 105a in a plan view. In a plan view, the emitter contact layer 105a is arranged at the center of the mesa structure formed by the sub-collector layer 110a, the collector layer 109a, the p-type base layer 108a, the base layer 107a, and the emitter layer 106a. Therefore, in a plan view, a portion of the emitter layer 106a is exposed around the emitter contact layer 105a.

Figure 1M:
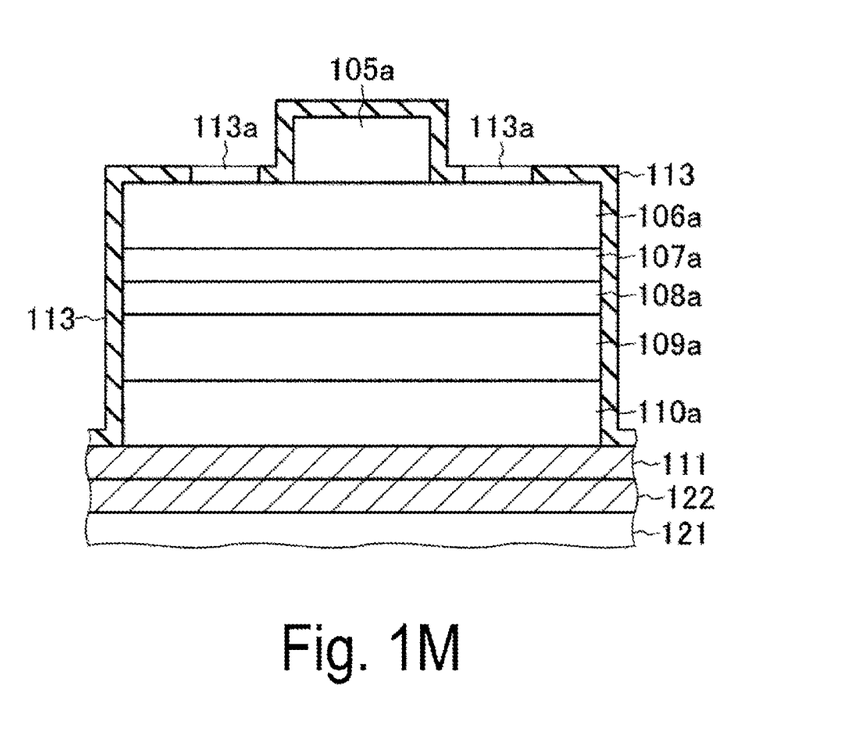
FIG. 1M is a cross-sectional view illustrating a state of an intermediate process for describing the method for producing the heterojunction bipolar transistor according to an embodiment of the present invention.

Next, a protective film 113 is formed to cover the sub-collector layer 110a, the collector layer 109a, the p-type base layer 108a, the base layer 107a, the emitter layer 106a, and the emitter contact layer 105a. Further, the protective film 113 includes an opening 113a penetrating therethrough around the emitter contact layer 105a. For example, the opening 113a can be formed by a known lithography technique and etching technique. The upper surface of the emitter layer 106a is exposed at the bottom of the opening 113a. The protective film 113 is formed from a material having high thermal resistance such as SiN because the high temperature treatment is performed in the subsequent steps. The opening 113a is formed at a position where the base electrode is to be formed.

Figure 1N:
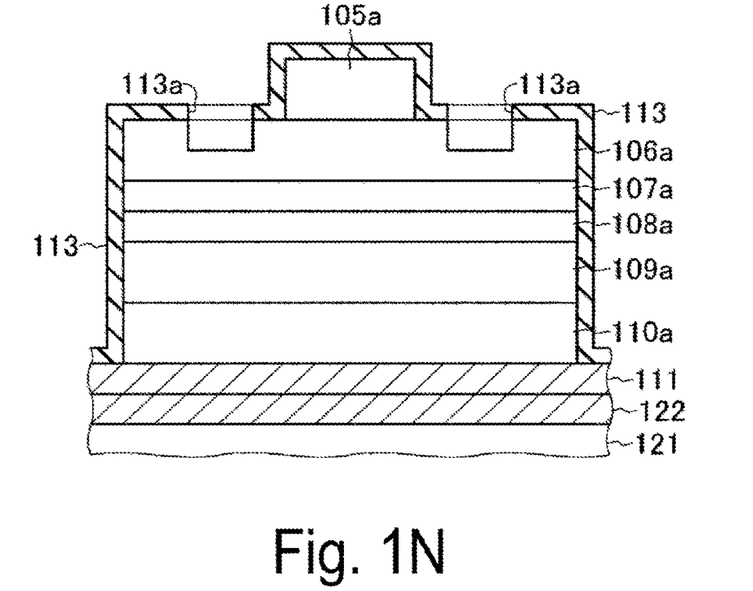
FIG. 1N is a cross-sectional view illustrating a state of an intermediate process for describing the method for producing the heterojunction bipolar transistor according to an embodiment of the present invention.
Figure 1O:
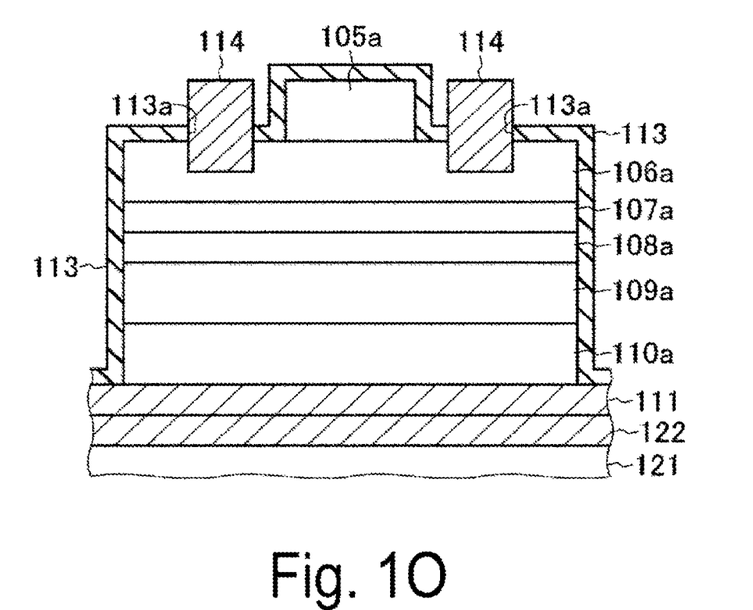
FIG. 1O is a cross-sectional view illustrating a state of an intermediate process for describing the method for producing the heterojunction bipolar transistor according to an embodiment of the present invention.

Next, as illustrated in FIG. 1N, the emitter layer 106a exposed at the bottom of the opening 113a is thinned. Next, as illustrated in FIG. 1O, a base electrode 114 that is ohmic-connected to the p-type base layer 108a is formed on the emitter layer 106a exposed at the bottom of the opening 113a, in this case, on the thinned emitter layer 106a (fifth step). The base electrode 114 is formed from an electrode material capable of forming ohmic contact with the p-type base layer 108a.

In the present embodiment, a high-concentration two-dimensional hole gas is formed at the interface between the emitter layer 106a and the base layer 107a by utilizing the effect of polarization, so that the base resistance is reduced. In the layer configuration described above, since the emitter layer 106a formed from AlGaAs has a high resistance, it may be difficult to reduce the contact resistance between the base electrode 114 and the p-type base layer 108a. Therefore, the emitter layer 106a at the portion where the base electrode 114 is formed is thinned.

In the above configuration, the concentration of the two-dimensional hole gas depends on the thickness of the emitter layer 106a. Therefore, if the emitter layer 106a is completely removed and penetrated to the base layer 107a, the two-dimensional hole gas disappears and the contact resistance becomes high. Therefore, from the viewpoint of contact resistance and two-dimensional hole gas concentration, it is necessary to find an optimum value for the thickness of the emitter layer 106a at the portion where the base electrode 114 is formed. For example, if the contact resistance between the base electrode and the base can be sufficiently reduced without thinning the emitter layer 106a, the above-described process of thinning the emitter layer 106a may be omitted.

Figure 1P:
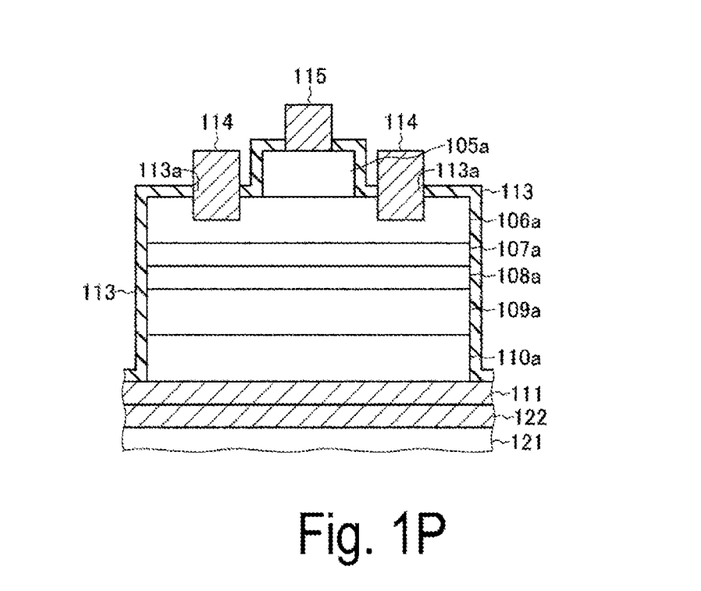
FIG. 1P is a cross-sectional view illustrating a state of an intermediate process for describing the method for producing the heterojunction bipolar transistor according to an embodiment of the present invention.

Next, as illustrated in FIG. 1P, an emitter electrode 115 is formed on the emitter contact layer 105a (sixth step). An opening is formed in a portion of protective film 13 on the upper surface of the emitter contact layer 105a, and the emitter electrode 115 is formed in this portion. The emitter electrode 115 is formed from a material capable of forming ohmic contact with the emitter contact layer 105a.

Heat treatment is performed in a state in which the base electrode 114 and the emitter electrode 115 are formed as described above. By this heat treatment, each electrode is formed as an ohmic contact and has a reduced resistance. Further, the first metal layer 111 and the second metal layer 122 used for bonding form ohmic contact with the sub-collector layer 110a and serve as a collector electrode.

As described above, it is possible to obtain a heterojunction bipolar transistor including the sub-collector layer 110a formed over the second substrate 121, the collector layer 109a formed on the sub-collector layer 110a, the p-type base layer 108a formed on the collector layer 109a, the base layer 107a formed on the p-type base layer 108a, the emitter layer 106a formed on the base layer 107a, the emitter contact layer 105a formed on the emitter layer 106a, the base electrode 114, the emitter electrode 115, and the collector electrode connected to the sub-collector layer 110a. In this heterojunction bipolar transistor, the sub-collector layer 110a, the collector layer 109a, the p-type base layer 108a, the base layer 107a, the emitter layer 106a, and the emitter contact layer 105a are formed over the second substrate 121 with the main surface as a Group V polar surface.

In the above description of the formation of the emitter electrode, the emitter electrode 115 having a width smaller than the mesa width of the emitter contact layer 105a in a plan view is formed after formation of the emitter contact layer 105a, but the present invention is not limited to this. For example, if the self-alignment step is technically applicable, the emitter electrode may be formed and then the emitter layer may be processed into a mesa shape with the emitter electrode used as a mask.

In this case, the emitter electrode is formed from a material in which the shape of the emitter electrode does not significantly deteriorate (change) due to heat treatment, and heating conditions are appropriately set so that the emitter electrode does not change significantly. Further, it is also possible to form the emitter electrode over the entire area of the emitter contact layer before the mesa shape is formed, perform heat treatment, and then form the emitter layer into the mesa shape. In this case, since the metal surface constituting the emitter electrode may be greatly roughened after the heat treatment, it may be necessary to flatten the surface of the emitter electrode formed in the entire area by a technique such as chemical mechanical polishing.

Further, the order of the electrode formation and the processing into the mesa shape is not limited to the above-described process order. For example, as described above, the formation of the emitter electrode and the processing of the emitter layer into the mesa shape are performed first by the self-alignment process, and then the base electrode is formed and the processing into the mesa shape of the base layer and others is performed. Further, in the above-described process, the heat treatment after formation of the electrodes is carried out collectively after formation of the emitter electrode and the base electrode, but the present invention is not limited to this, and each of the emitter electrode, the base electrode, and the collector electrode may be heat-treated for optimum ohmic connection.

When the sub-collector layer 110 is directly bonded to the second substrate 121, a portion of the sub-collector layer 110 is exposed, and the collector electrode is formed therein without using the first metal layer 111 and the second metal layer 122, the heat treatment is performed for ohmic connection of the collector electrode.

Figure 2:
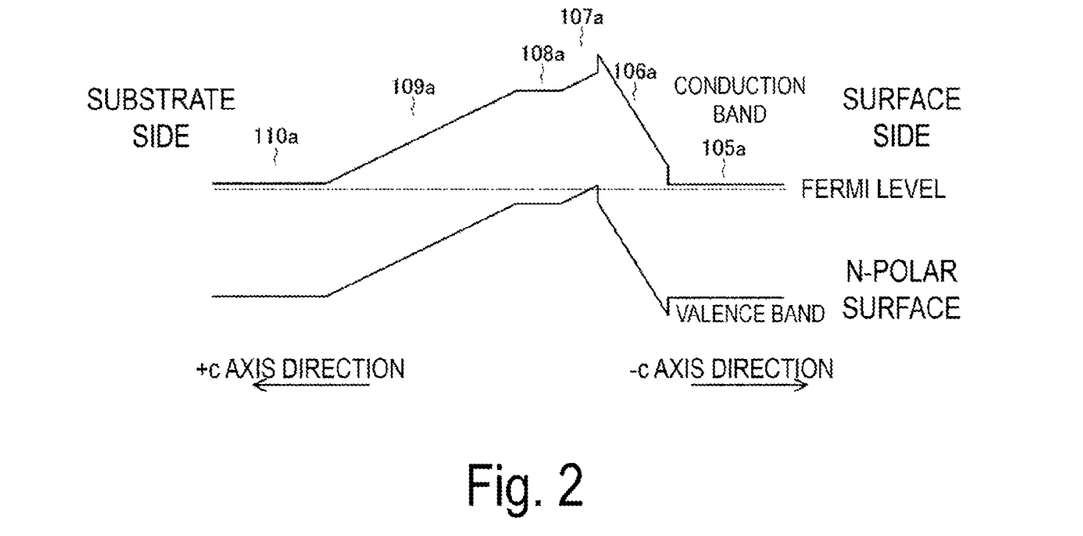
FIG. 2 is a band diagram illustrating a band lineup of the heterojunction bipolar transistor according to an embodiment.

Next, the features of the heterojunction bipolar transistor according to an embodiment of the present invention will be described with reference to the band diagram of FIG. 2. In FIG. 2, the electrodes are omitted. This heterojunction bipolar transistor is characterized by a band lineup of the emitter contact layer 105a, the emitter layer 106a, the base layer 107a, and the p-type base layer 108a.

As described above, the nitride semiconductor has therein spontaneous polarization and piezoelectric polarization in the c-axis direction. In a typical GaN-based HEMT formed on a Group III polar surface, a heterostructure of an undoped AlGaN layer/undoped GaN layer is formed so that the AlGaN layer is arranged on the surface side when viewed from the substrate side. With this layer configuration, due to the difference in the magnitude of polarization between the AlGaN layer and the GaN layer, the band of the AlGaN layer bends upward (high energy side) toward the surface side, and the band of the GaN layer bends downward toward the surface side (AlGaN side). In this way, a two-dimensional electron gas is formed.

However, the heterojunction bipolar transistor in the embodiment has a heterostructure in which the surface side as viewed from the substrate (sub-collector layer 110a) is the N-polar surface, and the emitter contact layer 105a formed from n$^+$ GaN, which is under the emitter layer 106a formed from undoped AlGaN, is the surface side. As a result, since the front surface side is an N-polar surface, as illustrated in FIG. 2, the direction of the polarization electric field is reversed, and the band of the emitter layer 106a is bent downward toward the surface side (the side of the emitter contact layer 105a). On the other hand, since the emitter contact layer 105a is strongly n-type doped, the depletion layer hardly spreads, the bending of the band is almost limited to the AlGaN side, and the influence of the two-dimensional electron gas is small.

Furthermore, when attention is paid to the heterojunction between the base layer 107a formed from undoped GaN and the emitter layer 106a, as a result of the band of the emitter layer 106a being strongly bent downward toward the surface (emitter contact layer 105a), the band of the base layer 107a is bent upward toward the surface in a direction that cancels this polarized electric field. In addition, in the p-type base layer 108a formed from GaN doped so as to be p-type, the depletion layer hardly spreads, so that the depletion is limited to the region of the base layer 107a/emitter layer 106a. As a result of the bands being bent upward toward the interface between the base layer 107a and the emitter layer 106a, the conduction band is lifted to the higher energy side than the Fermi level, and a two-dimensional hole gas is formed.

As described above, according to embodiments of the present invention, the sub-collector layer, the collector layer, the p-type base layer, the base layer, the emitter layer, and the emitter contact layer are formed over the substrate with the main surface as a Group V polar surface, so that the high-frequency characteristics of the heterojunction bipolar transistor using the nitride semiconductor can be enhanced without adopting the collector top structure.

The present invention is not limited to the embodiments described above, and it is obvious that many modifications and combinations can be implemented by a person having ordinary knowledge in the field within the technical spirit of the present invention.

REFERENCE SIGNS LIST

101 First substrate
102 Nucleation layer
103 Sacrificial layer
104 Etch stop layer
105 Emitter contact layer
106 Emitter layer
107 Base layer
108 p-type base layer
109 Collector layer
110 Sub-collector layer
111 First metal layer
112 Resist pattern
113 Protective film
113a Opening
114 Base electrode
115 Emitter electrode
121 Second substrate
122 Second metal layer

The invention claimed is:

1. A method for producing a heterojunction bipolar transistor, the method comprising:
   a first step of crystal-growing, over a first substrate in a following order with a main surface as a Group III polar surface,
      an emitter contact layer comprising a nitride semiconductor that is made n-type,
      an emitter layer comprising a nitride semiconductor having a bandgap larger than that of the nitride semiconductor of the emitter contact layer,
      a base layer comprising an undoped nitride semiconductor having a bandgap smaller than that of the nitride semiconductor of the emitter layer,
      a p-type base layer comprising the same nitride semiconductor as that of the base layer and made p-type,
      a collector layer comprising a nitride semiconductor that has the same bandgap as that of the nitride semiconductor of the p-type base layer and that is made n-type, and
      a sub-collector layer comprising the same nitride semiconductor as that of the collector layer and made n-type;
   a second step of bonding the first substrate and a second substrate;
   a third step of removing the first substrate to create a state in which the sub-collector layer, the collector layer, the p-type base layer, the base layer, the emitter layer, and the emitter contact layer are formed over the second substrate in this order with the main surface as a Group V polar surface;
   a fourth step of patterning the emitter contact layer into a mesa shape;
   a fifth step of forming a base electrode that is ohmic-connected to the p-type base layer on the emitter layer on a side of the mesa-shaped emitter contact layer; and
   a sixth step of forming an emitter electrode on the mesa-shaped emitter contact layer.

2. The method according to claim 1, wherein the fifth step comprises:
   thinning the emitter layer at a portion where the base electrode is formed; and
   forming the base electrode on the thinned emitter layer.

3. The method according to claim 1, further comprising:
   a seventh step of forming a first metal layer serving as a collector electrode on the sub-collector layer; and
   an eighth step of forming a second metal layer on the second substrate, the seventh step and the eighth step being performed before the second step, wherein in the second step, the first substrate and the second substrate are bonded together with the first metal layer and the second metal layer facing each other.

4. The method according to claim 1, wherein:
   the emitter contact layer, the base layer, the p-type base layer, the collector layer, and the sub-collector layer each comprise GaN; and
   the emitter layer comprises AlGaN.

5. A heterojunction bipolar transistor comprising:
   a sub-collector layer on a substrate, the sub-collector layer comprising a nitride semiconductor that is made n-type;

a collector layer on the sub-collector layer, the collector layer comprising the same nitride semiconductor as that of the sub-collector layer and being made n-type;
a p-type base layer on the collector layer, the p-type base layer comprising a nitride semiconductor having the same bandgap as that of the nitride semiconductor of the collector layer and being made p-type;
a base layer on the p-type base layer, the base layer comprising the same nitride semiconductor as that of the p-type base layer and being undoped;
an emitter layer on the base layer, the emitter layer comprising a nitride semiconductor having a bandgap larger than that of the nitride semiconductor of the base layer;
a mesa-shaped emitter contact layer on a surface of the emitter layer opposite the base layer, the mesa-shaped emitter contact layer comprising a nitride semiconductor having a bandgap smaller than that of the nitride semiconductor of the emitter layer and being made n-type;
a base electrode on the surface of the emitter layer opposite the base layer on a side of the mesa-shaped emitter contact layer in a plan view, wherein facing sides of the base electrode and the mesa-shaped emitter contact layer are laterally spaced apart in the plan view, and wherein the base electrode is ohmic-connected to the p-type base layer;
an emitter electrode on the mesa-shaped emitter contact layer; and
a collector electrode connected to the sub-collector layer, wherein the sub-collector layer, the collector layer, the p-type base layer, the base layer, the emitter layer, and the mesa-shaped emitter contact layer are over the substrate with a main surface as a Group V polar surface.

6. The heterojunction bipolar transistor according to claim 5, wherein the emitter layer at a portion where the base electrode is disposed is thinner than a region other than the portion.

7. The heterojunction bipolar transistor according to claim 5, wherein the collector electrode comprises a metal layer between the substrate and the sub-collector layer.

8. The heterojunction bipolar transistor according to claim 5, wherein:
the mesa-shaped emitter contact layer, the base layer, the p-type base layer, the collector layer, and the sub-collector layer each comprise GaN; and
the emitter layer comprises AlGaN.

9. The heterojunction bipolar transistor according to claim 5, wherein:
the sub-collector layer, the collector layer, the p-type base layer, the base layer, and the emitter layer each have a first width in the plan view;
the collector electrode has a second width in the plan view, the second width being greater than the first width;
the mesa-shaped emitter contact layer has a third width in the plan view, the third width being smaller than the first width; and
the mesa-shaped emitter contact layer is disposed in a central region of the emitter layer in the plan view.

10. The heterojunction bipolar transistor according to claim 5, wherein a width of the mesa-shaped emitter contact layer in the plan view is smaller than a width of the emitter layer in the plan view.

11. The heterojunction bipolar transistor according to claim 10, wherein the mesa-shaped emitter contact layer is disposed in a central region of the emitter layer in the plan view.

12. The heterojunction bipolar transistor according to claim 11, further comprising a second base electrode on the surface of the emitter layer opposite the base layer, wherein the base electrode is disposed on a first side of the mesa-shaped emitter contact layer in the plan view and the second base electrode is disposed on a second side of the mesa-shaped emitter contact layer in the plan view, the first side of the mesa-shaped emitter contact layer being opposite the second side of the mesa-shaped emitter contact layer.

13. The heterojunction bipolar transistor according to claim 5, wherein the collector electrode is disposed at a lower side of the heterojunction bipolar transistor opposite an upper side of the heterojunction bipolar transistor at which the base electrode and the emitter electrode are disposed.

14. The heterojunction bipolar transistor according to claim 5, wherein the collector electrode comprises a metal layer between the substrate and the sub-collector layer.

15. A heterojunction bipolar transistor comprising:
a collector electrode on an upper surface of a substrate;
a sub-collector layer on an upper surface of the collector electrode, the sub-collector layer comprising a nitride semiconductor that is made n-type;
a collector layer on an upper surface of the sub-collector layer, the collector layer comprising the same nitride semiconductor as that of the sub-collector layer and being made n-type;
a p-type base layer on an upper surface of the collector layer, the p-type base layer comprising a nitride semiconductor having the same bandgap as that of the nitride semiconductor of the collector layer and being made p-type;
a base layer on an upper surface of the p-type base layer, the base layer comprising the same nitride semiconductor as that of the p-type base layer and being undoped;
an emitter layer on an upper surface of the base layer, the emitter layer comprising a nitride semiconductor having a bandgap larger than that of the nitride semiconductor of the base layer;
a mesa-shaped emitter contact layer on an upper surface of the emitter layer, the mesa-shaped emitter contact layer comprising a nitride semiconductor having a bandgap smaller than that of the nitride semiconductor of the emitter layer and being made n-type, and the mesa-shaped emitter contact layer having a narrower width than the emitter layer in a plan view;
a base electrode on the upper surface of the emitter layer on a side of the mesa-shaped emitter contact layer in the plan view, wherein facing sides of the base electrode and the mesa-shaped emitter contact layer are laterally spaced apart in the plan view, and wherein the base electrode is ohmic-connected to the p-type base layer; and
an emitter electrode on an upper surface of the mesa-shaped emitter contact layer, wherein the collector electrode, the sub-collector layer, the collector layer, the p-type base layer, the base layer, the emitter layer, and the mesa-shaped emitter contact layer are over the substrate with a main surface as a Group V polar surface.

16. The heterojunction bipolar transistor according to claim 15, wherein:

the mesa-shaped emitter contact layer, the base layer, the p-type base layer, the collector layer, and the sub-collector layer each comprise GaN; and the emitter layer comprises AlGaN.

17. The heterojunction bipolar transistor according to claim 15, wherein:
the sub-collector layer, the collector layer, the p-type base layer, the base layer, and the emitter layer each have a first width in the plan view;
the collector electrode has a second width in the plan view, the second width being greater than the first width; and
the mesa-shaped emitter contact layer has a third width in the plan view, the third width being smaller than the first width.

18. The heterojunction bipolar transistor according to claim 17, wherein the mesa-shaped emitter contact layer is disposed in a central region of the emitter layer in the plan view.

19. The heterojunction bipolar transistor according to claim 15, wherein:
a width of the mesa-shaped emitter contact layer in the plan view is smaller than a width of the emitter layer in the plan view; and
the mesa-shaped emitter contact layer is disposed in a central region of the emitter layer in the plan view.

20. The heterojunction bipolar transistor according to claim 15, wherein the base electrode extends into the emitter layer.

* * * * *